(12) United States Patent
Biloiu et al.

(10) Patent No.: US 8,809,803 B2
(45) Date of Patent: Aug. 19, 2014

(54) INDUCTIVELY COUPLED PLASMA ION SOURCE WITH MULTIPLE ANTENNAS FOR WIDE ION BEAM

(71) Applicant: Varian Semiconductor Equipment Associates, Inc., Gloucester, MA (US)

(72) Inventors: Costel Biloiu, Rockport, MA (US); Joseph C. Olson, Beverly, MA (US); Edward W. Bell, Newbury, MA (US); Manny Sieradzki, Georgetown, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/961,060

(22) Filed: Aug. 7, 2013

(65) Prior Publication Data

US 2014/0042337 A1    Feb. 13, 2014

Related U.S. Application Data

(60) Provisional application No. 61/682,356, filed on Aug. 13, 2012.

(51) Int. Cl.
*H01J 27/00*    (2006.01)
*H01J 37/08*    (2006.01)

(52) U.S. Cl.
CPC ..................................... *H01J 37/08* (2013.01)
USPC ..................................... 250/423 R; 250/424

(58) Field of Classification Search
CPC ..... H01J 37/08; H01J 37/32412; H01J 27/02; H01J 37/04; H01J 37/32422
USPC ......................... 250/423 R, 424, 423 P, 423 F
See application file for complete search history.

(56) References Cited

U.S. PATENT DOCUMENTS

| 5,698,062 A | 12/1997 | Sakamoto et al. |
| 5,824,606 A | 10/1998 | Dible et al. |

(Continued)

FOREIGN PATENT DOCUMENTS

| EP | 0756309 A1 | 1/1997 |
| JP | 2001-023532 A | 1/2001 |
| JP | 2001-042099 A | 2/2001 |

OTHER PUBLICATIONS

Park, et al., "An Array of Inductively Coupled Plasma Sources for Large Area Plasma," Thin Solid Films, 355-356, Nov. 1, 1999, p. 252-255.

(Continued)

*Primary Examiner* — Nicole Ippolito
*Assistant Examiner* — Hanway Chang

(57) ABSTRACT

A wide ion beam source includes a plurality of RF windows arranged in a predetermined relationship, a single plasma chamber disposed on a first side of the plurality of RF windows, a plurality of RF antennas, each RF antenna of the plurality of RF antennas disposed on a second side of a respective RF window of the plurality of RF windows, the second side being opposite the first side, and a plurality of RF sources, each RF source coupled to a respective RF antenna of the plurality of RF antennas, wherein a difference in frequency of a first RF signal produced by a first RF source coupled to a first RF antenna from that of a second RF signal produced by a second RF source coupled to an RF antenna adjacent to the first RF antenna is greater than 10 kHz.

20 Claims, 5 Drawing Sheets

(56) References Cited

U.S. PATENT DOCUMENTS

| | | |
|---|---|---|
| 6,632,324 B2 | 10/2003 | Chan |
| 2007/0044715 A1 | 3/2007 | Blattner et al. |
| 2007/0137576 A1 | 6/2007 | Kurunczi et al. |
| 2009/0139963 A1 | 6/2009 | Panagopoulos et al. |
| 2010/0066252 A1 | 3/2010 | Reijonen et al. |

OTHER PUBLICATIONS

International Search Report and Written Opinion mailed Oct. 30, 2013 for PCT/US2013/054056 filed Aug. 8, 2013.

INDUCTIVELY COUPLED PLASMA ION SOURCE WITH MULTIPLE ANTENNAS FOR WIDE ION BEAM

CROSS-REFERENCE TO RELATED APPLICATIONS

This application claims the benefit of U.S. Provisional Patent Application Ser. No. 61/682,356, filed on Aug. 13, 2012, the entire content of which is hereby incorporated by reference in its entirety.

FIELD OF THE DISCLOSURE

The disclosure relates generally to the field of semiconductor device fabrication, and more particularly to an ion source having multiple antennas for producing a wide ion beam.

BACKGROUND OF THE DISCLOSURE

Ion implantation is a process used to dope ions into a work piece or target substrate. Large format ion implantation applications, such as implantation into large area flat panels, require extra wide (e.g. 2-6 meter wide) ribbon ion beams. In addition to having to provide high plasma densities necessary for sustaining high ion beam currents, the plasma sources employed in large format applications are targeted to provide very good plasma uniformity (1-2%) over extended lengths. For gaseous precursors, inductively coupled plasma (ICP) sources have proven to be a suitable solution for producing wide ribbon ion beams. For example, an RF inductively coupled plasma source provides reasonably high ion beam currents (about 1 mA/cm Boron) and relatively good uniformity (<2% over 700 mm). However, further extension of the ion beam width is not possible with a single RF antenna due to physical constraints on RF antenna and dielectric RF window lengths. For example, long antennas have high antenna inductance, which, for usual RF frequencies, requires matching units with non-physical tuning and loading capacitors values.

Moreover, overall antenna length is limited because an antenna may be designed to not exceed ¼ of the RF electromagnetic wavelength due to the standing wave effect that might develop in the antenna loops. Due to this consideration, for an operating frequency of 13.56 MHz, the maximum antenna length (taken by summing up the lengths of all antenna turns) is about 5 meters.

In addition, dielectric windows, which allow RF power transmission therethrough and provide vacuum sealing of plasma chambers, are constrained in size because windows generally must be made thicker as they are made larger. For example, in order to sustain 1 atmosphere of pressure under 250-300° Celsius thermal stress, a 1 meter long and 15 centimeter high window must have a thickness of about 15 millimeters in the case of quartz and about 10 millimeters in the case of alumina. However, thick windows provide poor RF power coupling with a detrimental effect on plasma density.

SUMMARY

In view of the foregoing, novel wide ion beam sources based upon RF plasmas are disclosed.

In an exemplary embodiment of the present disclosure, a wide ion beam source include a plurality of RF windows arranged in a predetermined relationship, a single plasma chamber disposed on a first side of the plurality of RF windows, a plurality of RF antennas, each RF antenna of the plurality of RF antennas disposed on a second side of a respective RF window of the plurality of RF windows, the second side being opposite the first side. The wide ion beam source further includes a plurality of RF sources, each RF source coupled to a respective RF antenna of the plurality of RF antennas, wherein a difference in frequency of a first RF signal produced by a first RF source coupled to a first RF antenna from that of a second RF signal produced by a second RF source coupled to an RF antenna adjacent to the first RF antenna is greater than 10 kHz.

In another embodiment, a method for producing a wide ion beam includes arranging a plurality of RF windows in a predetermined relationship adjacent a single plasma chamber along a first side of the plurality of RF windows, disposing an RF antenna of a plurality of RF antennas on a second side of a respective RF window of the plurality of RF windows, the second side being opposite the first side, and coupling an RF source of a plurality of RF sources to a respective RF antenna of the plurality of RF antennas, wherein a difference in frequency of a first RF signal produced by a first RF source coupled to a first RF antenna from that of a second RF signal produced by a second RF source coupled to an RF antenna adjacent to the first RF antenna is greater than 10 kHz.

In a further embodiment, a system for producing a wide ion beam includes a plurality of RF windows arranged in a predetermined relationship, a single plasma chamber disposed on a first side of the plurality of RF windows, and a plurality of RF antennas, wherein each RF antenna of the plurality of RF antennas is disposed on a second side of a respective RF window of the plurality of RF windows, the second side being opposite the first side. The system also includes a plurality of RF sources each configured to operate at a frequency within 2% of 13.56 MHz, wherein each RF source is coupled to a respective RF antenna of the plurality of RF antennas, wherein a difference in frequency of a first RF signal produced by a first RF source coupled to a first RF antenna from that of a second RF signal produced by a second RF source coupled to an RF antenna adjacent to the first RF antenna is greater than 10 kHz.

BRIEF DESCRIPTION OF THE DRAWINGS

By way of example, a specific embodiment of the disclosed device will now be described, with reference to the accompanying drawings, in which.

DETAILED DESCRIPTION

Figure 1:
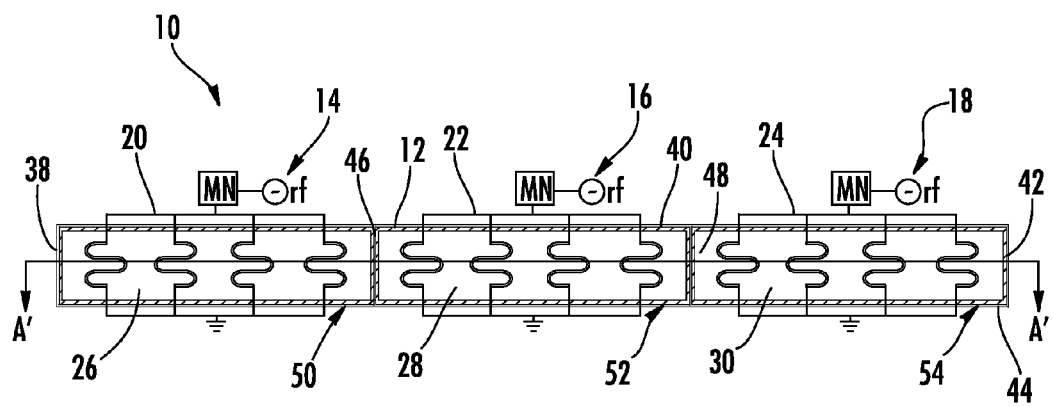
FIG. 1 is a top view illustrating an ion source in accordance with the present disclosure.

A device in accordance with the present disclosure will now be described more fully hereinafter with reference to the accompanying drawings, in which preferred embodiments of the device are shown. This device, however, may be embodied in many different forms and should not be construed as being limited to the embodiments set forth herein. Rather, these embodiments are provided so that this disclosure will be thorough and complete, and will fully convey the scope of the device to those skilled in the art. In the drawings, like numbers refer to like elements throughout.

The present embodiments relate to apparatus and methods for providing a wide ion source using RF plasmas. In various embodiments, a wide ion source is disclosed that facilitates the operation of multiple, spatially-overlapping plasmas to produce a very wide ion beam without requiring continuous monitoring and adjustment of the RF signal phases.

Figure 2:
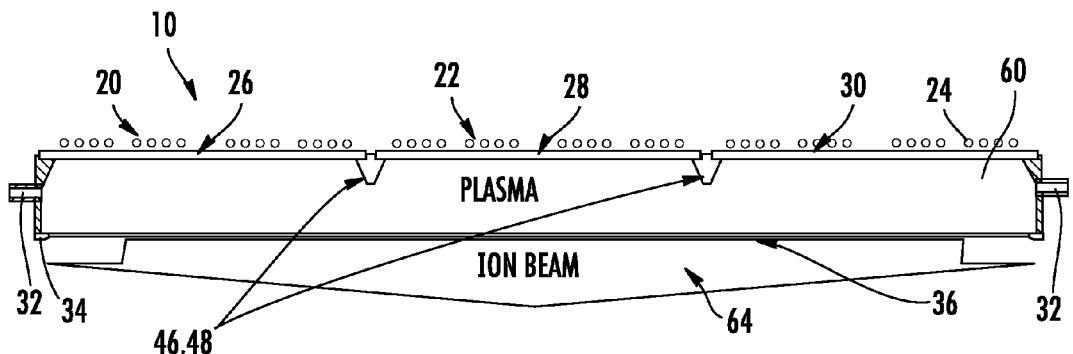
FIG. 2 is a cross-section of the ion source of FIG. 1 taken along line A-A' of FIG. 1.

Referring to FIGS. 1 and 2, an embodiment of a RF plasma ion source 10 (hereinafter referred to as "the RF ion source 10") in accordance with the present disclosure is shown. The RF ion source 10 may include a single plasma chamber 12, multiple RF sources 14, 16, and 18 (each including an RF generator "rf" and matching network "MN") having respective RF antennas 20, 22, and 24, multiple RF windows 26, 28, and 30, one or more gas inlets 32, and a face plate 34 having an extraction aperture 36 through which ions are extracted from the single plasma chamber 12. For the sake of convenience and clarity, terms such as "front," "rear," "top," "bottom," "up," "down," "inwardly," "outwardly," "horizontal," "vertical," "lateral," and "longitudinal" will be used herein to describe the relative placement and orientation of components of the RF ion source 10, each with respect to the geometry and orientation of the RF ion source 10 as it appears in FIG. 2. Said terminology will include the words specifically mentioned, derivatives thereof, and words of similar import. FIGS. 1 and 2 may also be described with reference to an XYZ coordinate system, such that the horizontal direction of FIG. 1 is parallel with the X-axis, the vertical direction of FIG. 1 is parallel with the Y-axis, and the Z-axis is perpendicular to the plane of FIG. 1. The axes of FIG. 2 are oriented such that the horizontal direction of FIG. 2 is parallel with the X-axis, the vertical direction of FIG. 2 is parallel with the Z-axis, and the Y-axis is perpendicular to the plane of FIG. 2.

The plasma chamber 12 may be a rectangular, cylindrical or more complex-shaped enclosure provided for holding a feed gas at low pressure. The plasma chamber 12 may include vertically-extending (i.e. extending the z direction in FIG. 2) sidewalls 38, 40, 42, and 44 that define an interior space having a total width in the x direction of 3 meters. The plasma chamber 12 may be made smaller or larger depending on the width of a desired ion beam, such as a ribbon ion beam. Elongated joint shoulders 46 and 48 may extend in the y direction (FIG. 2) across the open top end of the plasma chamber 12 in a spaced, parallel relationship to RF window supports 50, 52, and 54 that may have the same characteristics, shape and size. The face plate 34 seals the bottom end of the plasma chamber 12. An extraction aperture 36, which may extend across the entire face plate 34 of the plasma chamber 12, may provide an opening through which a wide ion beam may be extracted from the plasma chamber 12 as described below. The extraction aperture 36 may be an opening almost the entire 3 m length of the RF ion source 10. In one embodiment, the extraction aperture 36 is an approximately rectangular opening 3-30 millimeters (mm) in extent in the y direction and the full size of the ion beam (i.e., 3 meters (m) in the x direction). The face plate 34 may be 3-10 mm thick in the z direction and the edges of the extraction aperture 36 may be configured to better form a beam when ions are extracted from the plasma. The sidewalls 38, 40, 42 and 44, joint shoulders 46 and 48, may be formed of aluminum, aluminum alloys, or stainless steel. The face plate may be made of tungsten, stainless steel, graphite or a dielectric such as alumina, quartz or sapphire. Inside the plasma chamber, thin liners made of quartz, graphite, silicon carbide or silicon sprayed aluminum might be used to cover metal plasma chamber walls.

The RF windows 26, 28 and 30 may be planar members and may each have a shape in the horizontal plane that is similar to the shape of the RF window supports 50, 52 and 54. The RF windows 26, 28, and 30 may be arranged in a predetermined relationship. For example, the RF windows 26, 28, and 30 may be arranged to lie parallel to one another. The RF windows 26, 28, and 30 may lie in the same plane, that is, may have a coplanar relationship to one another. The embodiments are not limited in this context. The RF windows 26, 28 and 30 may be mounted within, and may vacuum seal, the RF window supports 50, 52 and 54. For example, the edges of the RF windows 26, 28 and 30 may be seated within recesses formed in the vertical surfaces of the sidewalls 38, 40, 42 and 44 and joint shoulders 46 and 48. Alternatively, it is contemplated that the RF windows 26, 28 and 30 may be fastened to the top surfaces of the sidewalls 38, 40, 42 and 44 and joint shoulders 46 and 48, such as with adhesives or mechanical fasteners. It is further contemplated that high temperature O-rings or other suitable sealing member may be disposed intermediate the edges of the RF windows 26, 28 and 30 and the sidewalls 38, 40, 42 and 44 and joint shoulders 46 and 48 for establishing a vacuum seal therebetween. The RF windows 26, 28 and 30 may thus be disposed in a horizontal orientation vertically intermediate the interior of the plasma chamber 12 and the RF antennas 20, 22 and 24 (described below).

The exemplary embodiment of the RF ion source 10 is shown in FIGS. 1 and 2 with three RF window supports 50, 52 and 54 having three respective RF windows 26, 28 and 30 disposed therein, wherein each RF window 26, 28 and 30 may be 1 meter wide. Thus, and end-to-end dimension of the RF windows 26, 28, 30, which are arranged in a linear relationship, may be 3 meters. However, since the RF ion source 10 is provided with independent RF sources, such as RF sources 14, 16 and 18, there is no constraint on the number of RF window supports, RF windows, or associated RF antennas and RF sources. Moreover, the RF antennas 20, 22 and 24 can be arranged in variety of configurations. For example, the RF antennas 20, 22 and 24 may be arranged in a 1-D pattern (i.e. 1 row by multiple columns) to provide a linear plasma source, or in a 2-D pattern (i.e. multiple rows by multiple columns) for large area ion assisted deposition. Because each RF antenna 20, 22 and 24 is fed by an independent RF chain (i.e. RF generator+matching network+RF voltage equilibration capacitor) the plasma source width (and implicitly the extracted beam width) in the case of 1-D geometry and the surface area in the case of 2-D geometry are theoretically unlimited. Thus the present embodiments extend to ion sources that may generate ion beams having cross sections that extend for many meters in two mutually perpendicular directions.

The RF windows 26, 28 and 30 are the media through which RF energy from the RF antennas 20, 22 and 24 are coupled to the feed gas 60 inside the plasma chamber 12, as further described below. The RF windows 26, 28 and 30 may be formed of any conventional material, including, but not limited to, alumina, sapphire, or quartz, that is capable of facilitating such coupling. Although alumina and quartz provide desirable properties for certain applications, they have relatively low thermal conductivity and may be prone to vacuum seal failures with the sidewalls 38, 40, 42 and 44 of the plasma chamber 12 at high operating temperatures.

As illustrated in FIG. 2, the RF sources 14, 16 and 18 and respective RF antennas 20, 22 and 24 may be disposed above the RF windows 26, 28 and 30 for providing effective RF energy coupling to the low pressure feed gas 60 inside the plasma chamber 12. The RF antennas 20, 22 and 24 may have a serpentine shape, as shown in FIG. 1, which will be familiar to those of ordinary skill in the art. However, the particular shape, size, and configuration of the RF antennas 20, 22 and/or 24 may be varied without departing from the present disclosure. For example, RF antennas of the flat spiral variety may be employed, such as those shown in FIG. 3. In the FIG. 3 embodiment RF ion source 300 includes RF generators rf1, rf2, and rf3 coupled to respective flat spiral RF antennas 302, 304 and 306 through matching networks MN1, MN2 and MN3 and voltage equilibrating capacitors C1, C2, and C3.

Referring again to FIGS. 1 and 2, during operation of the RF ion source 10, the feed gas 60 is supplied to the interior of the plasma chamber 12 via gas inlets 32 that are evenly spaced about the perimeter of the plasma chamber 12. The feed gas 60 may be, or may include or contain, in some embodiments, hydrogen, helium, oxygen, nitrogen, arsenic, boron, phosphorus, aluminum, indium, antimony, carborane, alkanes, or other p-type or n-type dopant contained gas mixtures. The RF sources 14, 16 and 18 supply RF power to the plasma chamber 12 via the RF antennas 20, 22 and 24 and through the RF windows 26, 28, 30 to disassociate and ionize the dopant-containing gas molecules in the feed gas 60 and thereby produce desired ionic species. The dopant ions thus generated are subsequently extracted from the plasma chamber 12 by extraction electrodes (not shown) positioned at or adjacent to the face plate 34 to form a wide ion beam 64 that is directed toward a substrate (not shown). As illustrated more clearly in FIG. 2, plasma is thus created by the independent RF sources 14, 16 and 18 in a single plasma chamber 12 (i.e. there are no walls dividing the chamber 12 into separate spaces). Independent powering of each RF source 14, 16 and 18 and a multicusp magnetic field configuration that surrounds the plasma source (not shown) provides greater flexibility in facilitating plasma uniformity across a plasma chamber having such an extended width (e.g. 3 meters in the exemplary embodiment). The multicusp magnetic field is produced by appropriately-situated permanent magnets, and may be used to make a more uniform plasma in the ion extraction region.

Since the feed gas inlets 32 are evenly distributed about the perimeter of the plasma chamber 12, the only remaining considerations for ensuring plasma uniformity are the dimensions of the joint shoulders 46 and 48 (in both z and x directions), the localized power deposition (i.e., intensity) given by the spatial separation of the RF antennas 20, 22 and 24, and interference effects between the RF antennas 20, 22 and 24. Each of these considerations will now be addressed in-turn.

A typical inductively coupled (ICP) plasma with an electron temperature of about 3-4 eV and an electron density of about $1\text{-}5\times10^{11}$ cm$^{-3}$ will be characterized by an electron collision frequency of $\sim1\text{-}5\times10^6$ sec$^{-1}$, and consequently a plasma conductivity $\sigma = ne^2/m_e v_c \approx 2\text{-}6\times10^3$ $\Omega^{-1}$ m$^{-1}$. Thus, for a 13.56 MHz RF driving frequency and low operating pressure (e.g., several mTorr), the plasma will have a skin depth (the depth beneath the RF window where most of the RF power is deposited) of $\delta = (2/\omega\mu_0\sigma)^{1/2} \approx 2\text{-}3$ cm. It therefore follows that if the joint shoulders 46 and 48 are made shorter than about 2-3 cm in the z direction they will not affect the uniformity of the plasma in the plasma chamber 12, since the RF power emitted by the RF antennas 20, 22 and 24 will be deposited deeper in the plasma chamber 12 than the lower termini of the joint shoulders 46 and 48. The dimension of the joint shoulders 46 and 48 in the x direction may be 2-2.5 cm to provide adequate structural strength for supporting the RF windows 26, 28 and 30, as well as to provide adequate space to accommodate the O-rings. These o-rings are made of temperature resistant fluorocarbon rubber and are placed in grooves that surround the RF window supports 50, 52 and 54. They project 1-3 mm out of the grooves so that RF windows 26, 28 and 30 sit on them and thus, when the chamber is pumped down, they ensure plasma chamber vacuum sealing.

Figure 3:
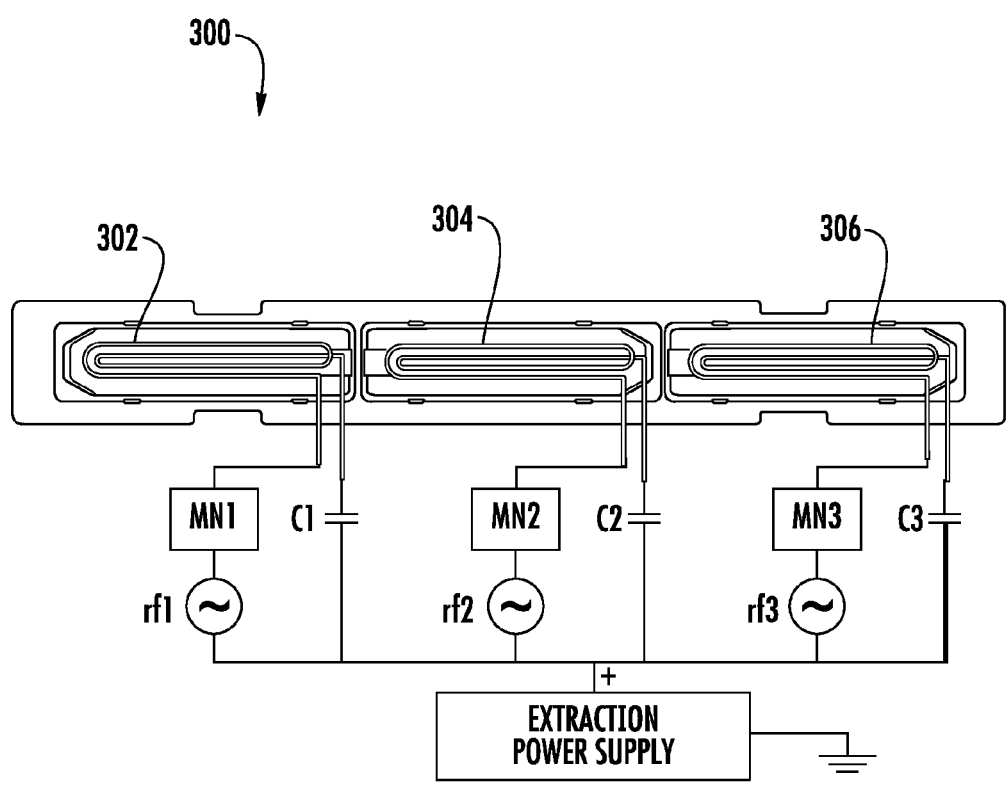
FIG. 3 is a top view illustrating an alternative ion source in accordance with the present disclosure.

With regard to the spatial separation of the RF antennas 20, 22 and 24, the RF antennas 20, 22 and 24 may be positioned very close to one another, but may be spaced apart by at least 1.5 centimeters to prevent electrical arcing between the RF antennas 20, 22 and 24 in high voltage situations, such as may occur during a plasma ignition stage. The maximum separation distance between two adjacent antennas at which non-uniformity in plasma density will start to appear is about 3-4 skin plasma skin depths. As shown in FIG. 3, each of the RF antennas 302, 304 and 306 may be provided with an appropriate RF generator (rf1, rf2, rf3) and appropriate matching network (MN1, MN2, MN3). In order to promote even distribution of voltage along the RF antennas 302, 304 and 306, the "grounded" legs of each of the RF antennas may be provided with an equilibration capacitor (C1-C3). To extract positive ions the plasma source should be at an elevated electrical potential up to 100 kV that is ensured by an extraction power supply. Then the extraction electrode system, which typically is composed of a ground electrode and a suppression electrode, may extract positive ions with energy equal to the electrical potential drop between the plasma chamber and the electrical ground.

With regard to the effect of cross talk or interference between the RF antennas 20, 22 and 24 (or 302, 304 and 306), the inventors have found that even if the RF sources 14, 16 and 18 are set to operate at the same driving frequency small differences in the actual operating frequencies may still exist. This is because the frequency accuracy of a typical RF source is about ±0.005%, which equates to about ±700 Hz for a 13.56 MHz driving frequency. This slight difference in frequencies may result in an undesirable modulation of the induced RF electric field in the plasma. For example, the electric field of two RF waves having the same amplitude but different frequencies may be described by $$y_{1,2} = A \sin(\omega_{1,2} t + \phi_{1,2}) \quad (1)$$

where A is the amplitude of the electric field (for simplicity taken equal for both waves), ω the pulsation is equal to 2πf-with f the frequency, and φ the initial phase. The resultant RF electric field is thus given by $$y_R = 2A \sin\left(\frac{\omega_1 + \omega_2}{2} t + \frac{\phi_1 + \phi_2}{2}\right) \cos\left(\frac{\omega_1 - \omega_2}{2} t + \frac{\phi_1 - \phi_2}{2}\right) \quad (2)$$

Figure 4A:
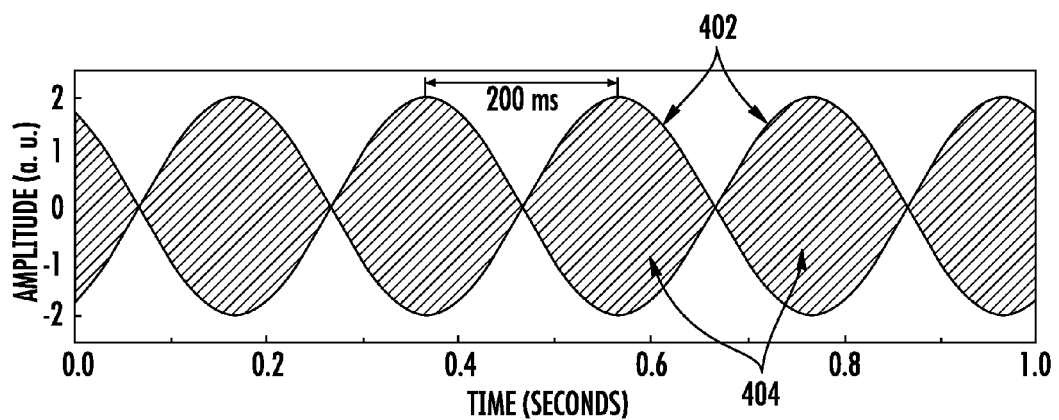
FIG. 4a is a graph illustrating the calculated modulation effects for two waves of 13.56 MHz that differ in operating frequency by 5 Hz.

The resultant sinusoidal wave is thus modulated by a periodic function with a frequency Δf=f1-f2. This is illustrated in FIG. 4a, which shows the calculated modulation effects for two waves of 13.56 MHz that differ in operating frequency by 5 Hz. Curve 402 indicates the envelope of the modulated resultant wave and area 404 indicates the 13.56 MHz wave (not clearly discernible on such long temporal scale).

Figure 4B:
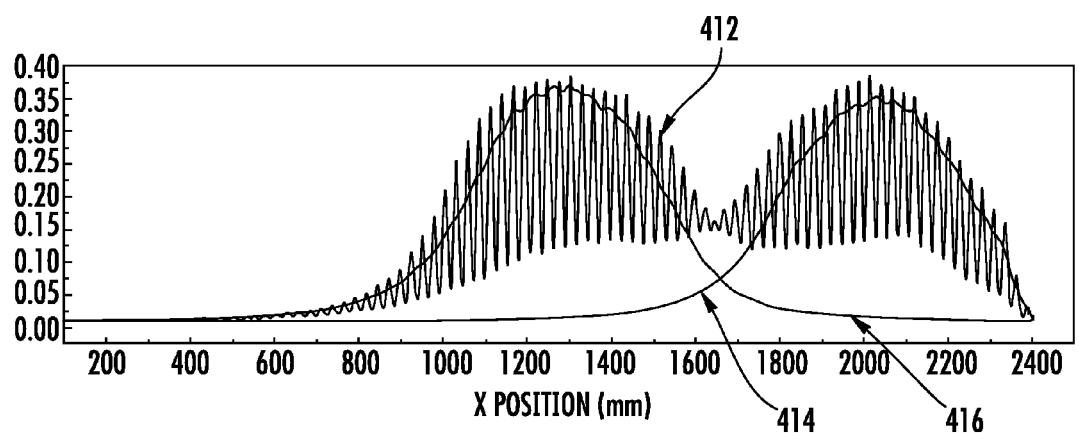
FIG. 4b is a graph illustrating measured beam profiles for an ion source having two RF sources set to operate at the same frequency.

Referring to FIG. 4b, measured beam profiles are shown for first and second independent RF sources, wherein both sources are operated at 13.56 MHz and deliver 800 W (for the clarity of the figure simultaneous operation of only two RF sources is shown). The profiles are measured by a traveling Faraday cup that moves in the x-direction to acquire an ion beam current measurement along the entire length of the beam. Curve 414 represents the beam profile generated by operation of only the first RF source, and curve 416 represents the beam profile generated by operation of only the second RF source. Curve 412 represents the beam profile generated by simultaneous operation of both the first and second RF sources and illustrates the characteristic, and undesirable, modulation effect. In the example of FIG. 4b, the current fluctuates along the x-direction every 20-25 mm. In particular, the current fluctuates by up to about 75% in some regions over distances of about 20-25 mm. This is not a periodical spatial fluctuation but a periodical temporal fluctuation (the "wave beating effect") because the beam profile is acquired with a Faraday cup that moves at a constant speed across the beam. Taking another beam profile, the fluctuations show the same spatial periodicity but the peaks and valleys are located at different x positions. Accordingly, the very small differences in operating frequency between different RF sources that are used to power a multiple-RF-source ion source, which may be unavoidable in even the most carefully designed systems, may result in unacceptable variations of plasma density as function of time and consequently in ion beam current variation as a function time and implicitly as function of position at the target surface in such an ion source.

Advantageously, the inventors have found that, rather than seeking to eliminate the very small difference in RF frequency between different RF sources, increasing the difference in frequency between different RF sources can eliminate the aforementioned problem. Specifically, the inventors have identified a range of RF frequency differences between different RF sources that is effective in reducing or eliminating current variations in an ion source powered by the different RF sources. More particularly, the present inventors have found that if the RF sources are set to run at different frequencies that differ, for example, by 10's to 100's of kHz, then the RF modulation effect may be observed, but is very fast, such as 10 μs, and no plasma density modulation effects can be observed in the resultant beam profile.

Figure 4C:
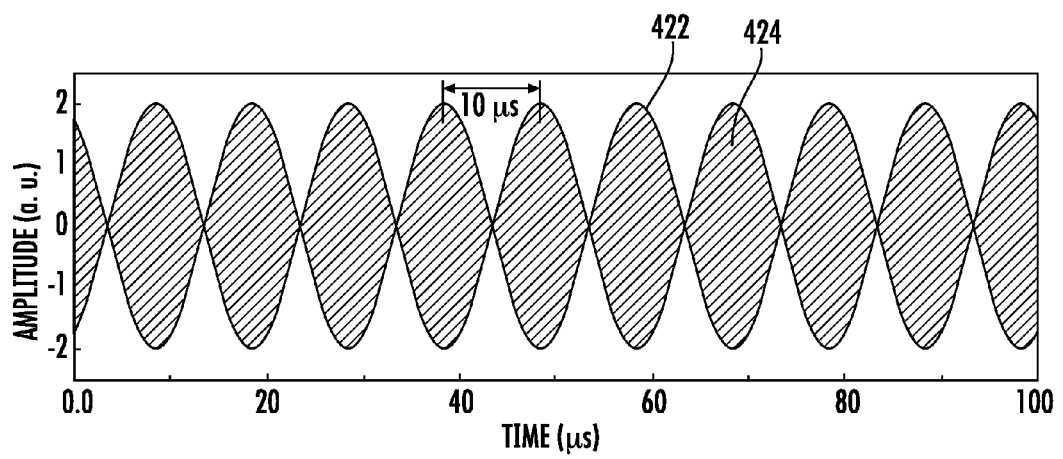
FIG. 4c is a graph illustrating the calculated modulation effects for two waves of 13.56 MHz that differ in operating frequency by 100 KHz, illustrated over 100 microseconds.

FIG. 4c is a graph illustrating the calculated modulation effects for two waves of 13.56 MHz that differ in operating frequency by 100 KHz, illustrated over 100 microseconds. Curve 422 is an envelope of the modulated resultant wave. Within curve 422 is the 13.56 MHz wave, which is not clearly discernable on such a long temporal scale, but is suggested by the shaded region 424. Due to the small period of curve 422 (approximately 10 microseconds), there is no significant macroscopic effect on plasma density nor implicitly on the ion beam current uniformity.

Figure 4D:
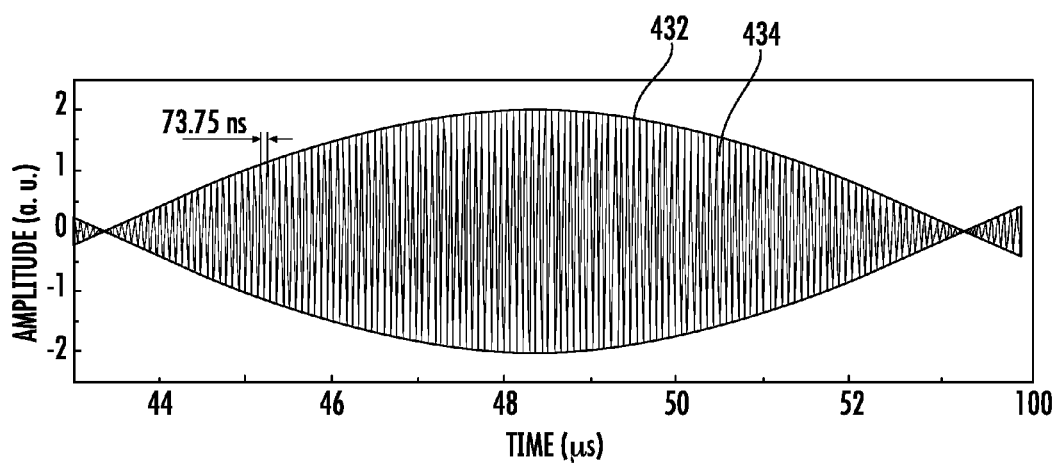
FIG. 4d is a graph illustrating the calculated modulation effects for two waves of 13.56 MHz that differ in operating frequency by 100 KHz, illustrated over approximately 10 microseconds.

FIG. 4d is a graph illustrating the graph of FIG. 4c at a greater level of magnification. Curve 432 is an envelope that corresponds to curve 422, and curve 434 is the 13.56 MHz wave. The period of curve 434 is approximately 73.75 ns, as marked in FIG. 4d.

Operating a 13.56 MHz generator at a frequency that is shifted by at least 0.5% and less than 1% with respect to the nominal RF frequency and with respect to a generator coupled to a physically adjacent antenna does not prevent the generator from operating properly. For instance, the amount of reflected power is ~100 W for 1.5 kW of forward power.

Furthermore, once the running frequency is chosen, the matching network unit may be calibrated for that frequency so the plasma impedance will be matched for zero reflected power.

In the case of multiple RF systems running at different power levels (i.e., different wave amplitudes) and different frequencies, the resultant wave amplitude is given by Equation 3.

$$A_R^2 = \sum_{i=1}^{n} A_i^2 + \sum_{j>i}\sum_{i=1}^{n} A_i A_j \cos\left(\frac{\omega_j - \omega_i}{2}t + \frac{\phi_j - \phi_i}{2}\right) \quad (3)$$

For large values of "n", the second term in the right-hand side of Equation (3) is negligible, and the square of resultant amplitude is approximately a sum of the square of each wave amplitude $A_i$. No interference effects are produced because the independent waves $A_i$ are essentially incoherent. In a practical case of running with only few RF generators at slightly different frequencies (e.g., 10-100 kHz) the effect of frequency modulation is negligible because random distribution of different modulation patterns reduces non-uniformity arising from non-coherence of the waves.

Figure 5:
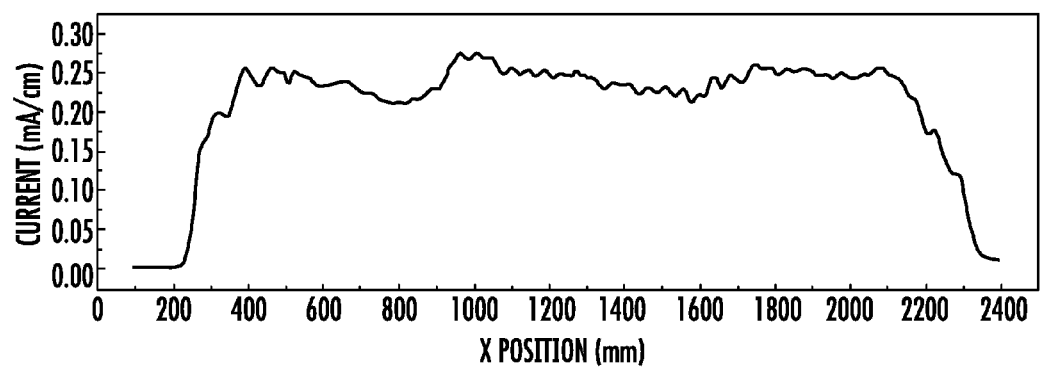
FIG. 5. is a graph illustrating measured beam profiles for an ion source having three RF sources set to operate at different frequencies.

FIG. 5 shows a measured beam profile obtained for an ICP ion source having three RF sources operating simultaneously and dissipating power in a common plasma chamber (similar to the exemplary embodiment of the present disclosure described above). In this example, the center RF source was set to operate at a frequency of 13.56 MHz and the adjacent RF sources were offset relative thereto by 0.1 MHz to operate at 13.46 MHz and 13.66 MHz, respectively. As can be seen, no modulation pattern could be observed and the beam uniformity was about 8%.

In summary, RF sources such as the RF ion source 10 of the present disclosure facilitate the operation of multiple, spatially-overlapping plasmas to produce a very wide ion beam without requiring continuous monitoring and adjustment of the RF signal phases. In addition, the operation of the RF sources at similar, though slightly different (RF frequency difference≤2%), RF frequencies ensures that plasma characteristics generated by each RF source are the same (e.g. the RF sources 14, 16 and 18 generate plasmas that exhibit no differences in plasma density, plasma potential and electron temperature between adjacent plasmas) and thus display good overall uniformity.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The invention claimed is:

1. A wide ion beam source comprising:
a plurality of RF windows arranged in a predetermined relationship;
a single plasma chamber disposed on a first side of the plurality of RF windows;
a plurality of RF antennas, each RF antenna of the plurality of RF antennas disposed on a second side of a respective RF window of the plurality of RF windows, the second side being opposite the first side; and
a plurality of RF sources, each RF source coupled to a respective RF antenna of the plurality of RF antennas, wherein a difference in frequency of a first RF signal produced by a first RF source coupled to a first RF antenna from that of a second RF signal produced by a second RF source coupled to an RF antenna adjacent to the first RF antenna is greater than 10 kHz.

2. The wide ion beam source of claim 1, wherein the difference in frequency is less than 100 kHz.

3. The wide ion beam source of claim 1, wherein the difference in frequency of the first RF signal produced by the first RF source from that of the second RF signal produced by the second RF source is at least 5% and less than 1.0%.

4. The wide ion beam source of claim 1, wherein an end-to-end dimension of the plurality of RF windows is at least two meters.

5. The wide ion beam source of claim 1, wherein the plurality of RF sources operate independently of each other.

6. The wide ion beam source of claim 1, wherein each RF source of the plurality of RF sources further comprises a respective matching network and a respective RF voltage equilibrium capacitor.

7. The wide ion beam source of claim 6, wherein the respective matching network is calibrated to the frequency of its respective RF source.

8. The wide ion beam source of claim 1, wherein the predetermined relationship of the plurality of RF windows comprises a coplanar relationship.

9. The wide ion beam source of claim 1, wherein the plurality of RF sources comprises:
a first source configured to produce a first RF signal at a frequency of 13.46 MHz;
a second source configured to produce a second RF signal at a frequency of 13.56 MHz; and
a third source configured to produce a third RF signal at a frequency of 13.66 MHz.

10. The wide ion beam source of claim 1, further comprising:
an extraction aperture situated on a periphery of the single plasma chamber opposite from the plurality of RF windows, the extraction aperture configured to extract ions from the single plasma chamber,
wherein the wide ion beam source is configured to generate an ion beam after extraction through the extraction aperture having a uniformity of 8% or less.

11. A method for producing a wide ion beam comprising:
arranging a plurality of RF windows in a predetermined relationship adjacent a single plasma chamber along a first side of the plurality of RF windows;
disposing an RF antenna of a plurality of RF antennas on a second side of a respective RF window of the plurality of RF windows, the second side being opposite the first side; and
coupling an RF source of a plurality of RF sources to a respective RF antenna of the plurality of RF antennas, wherein a difference in frequency of a first RF signal produced by a first RF source coupled to a first RF antenna from that of a second RF signal produced by a second RF source coupled to an RF antenna adjacent to the first RF antenna is greater than 10 kHz.

12. The method of claim 11, wherein the difference in frequency is less than 100 kHz.

13. The method of claim 11, further comprising configuring the first RF source to operate at a frequency that differs from the frequency at which the second RF source is configured to operate by at least 0.5% and less than 1.0%.

14. The method of claim 11, wherein arranging the plurality of RF windows comprises arranging the plurality of RF windows to have an end-to-end dimension of at least two meters.

15. The method of claim 11, further comprising operating the plurality of RF sources independently of each other.

16. The method of claim 11, further comprising spacing the RF antennas with respect to one another by at least 1.5 centimeters.

17. A system for producing a wide ion beam comprising:
a plurality of RF windows arranged in a predetermined relationship;
a single plasma chamber disposed on a first side of the plurality of RF windows;
a plurality of RF antennas, wherein each RF antenna of the plurality of RF antennas is disposed on a second side of a respective RF window of the plurality of RF windows, the second side being opposite the first side; and
a plurality of RF sources each configured to operate at a frequency within 2% of 13.56 MHz, wherein each RF source is coupled to a respective RF antenna of the plurality of RF antennas, wherein a difference in frequency of a first RF signal produced by a first RF source coupled to a first RF antenna from that of a second RF signal produced by a second RF source coupled to an RF antenna adjacent to the first RF antenna is greater than 10 kHz.

18. The system of claim 17, wherein the difference in frequency of the first RF signal produced by the first RF source from that of the second RF signal produced by the second RF source is at least 5% and less than 1.0%.

19. The system of claim 17, wherein the plurality of RF sources operate independently of each other.

20. The system of claim 17, comprising at least three RF windows, at least three RF antennas, each RF antenna being coupled to a respective RF window, and at least three RF sources, each RF source being coupled to a respective RF antenna.

* * * * *

UNITED STATES PATENT AND TRADEMARK OFFICE
CERTIFICATE OF CORRECTION

PATENT NO. : 8,809,803 B2  
APPLICATION NO. : 13/961060  
DATED : August 19, 2014  
INVENTOR(S) : Costel Biloiu et al.

Page 1 of 1

It is certified that error appears in the above-identified patent and that said Letters Patent is hereby corrected as shown below:

In the Claims,

In Column 9, Claim 3, please amend line 4 as follows:

--the second RF source is at least 0.5% and less than 1.0%.--

In Column 10, Claim 18, please amend line 4 as follows:

--second RF source is at least 0.5% and less than 1.0%--

Signed and Sealed this  
Twenty-ninth Day of September, 2015

Michelle K. Lee  
*Director of the United States Patent and Trademark Office*